(12) United States Patent
Hsieh (10) Patent No.: US 9,054,578 B2
(45) Date of Patent: Jun. 9, 2015

(54) HYBRID DRIVER INCLUDING A TURBO MODE

(71) Applicant: MoSys, Inc., Santa Clara, CA (US)

(72) Inventor: Kuo-Chiang Hsieh, Palo Alto, CA (US)

(73) Assignee: MoSys, Inc., Santa Clara, CA (US)

( * ) Notice: Subject to any disclaimer, the term of this patent is extended or adjusted under 35 U.S.C. 154(b) by 0 days.

(21) Appl. No.: 13/923,160

(22) Filed: Jun. 20, 2013

(65) Prior Publication Data

US 2013/0342242 A1 Dec. 26, 2013

Related U.S. Application Data

(60) Provisional application No. 61/662,322, filed on Jun. 20, 2012.

(51) Int. Cl.
*H03K 3/00* (2006.01)
*H02M 1/088* (2006.01)
*H03K 19/017* (2006.01)

(52) U.S. Cl.
CPC ......... *H02M 1/088* (2013.01); *H03K 19/01707* (2013.01)

(58) Field of Classification Search
USPC .......................................................... 327/110
See application file for complete search history.

(56) References Cited

U.S. PATENT DOCUMENTS

| | | | | |
|---|---|---|---|---|
| 5,402,387 A * | 3/1995 | Hotta | ...................... | 365/230.08 |
| 5,801,548 A * | 9/1998 | Lee et al. | ......................... | 326/44 |
| 6,246,270 B1 * | 6/2001 | Wang et al. | ................... | 327/111 |
| 6,812,733 B1 * | 11/2004 | Plasterer et al. | ................ | 326/30 |
| 6,940,302 B1 * | 9/2005 | Shumarayev et al. | ......... | 326/26 |
| 6,975,135 B1 * | 12/2005 | Bui | ................ | 326/29 |
| 7,109,743 B2 * | 9/2006 | Shumarayev et al. | ......... | 326/26 |
| 7,362,146 B2 * | 4/2008 | Macaluso | ..................... | 327/108 |
| 7,501,851 B2 * | 3/2009 | Venditti et al. | .................. | 326/30 |
| 7,643,563 B2 * | 1/2010 | Huang et al. | .................. | 375/257 |
| 8,149,024 B2 * | 4/2012 | Liu et al. | ....................... | 327/108 |
| 8,258,813 B2 * | 9/2012 | Groepl et al. | ................... | 326/82 |
| 8,493,103 B2 | 7/2013 | Fukuda et al. | | |
| 8,570,881 B2 * | 10/2013 | Talbot et al. | .................. | 370/252 |
| 2005/0032501 A1 * | 2/2005 | Huang et al. | .................. | 455/402 |
| 2005/0057280 A1 | 3/2005 | Groen et al. | | |
| 2008/0034378 A1 * | 2/2008 | Kumar et al. | ................. | 719/321 |
| 2013/0342241 A1 * | 12/2013 | Boecker et al. | ............... | 327/108 |

* cited by examiner

*Primary Examiner* — Ryan Jager
(74) *Attorney, Agent, or Firm* — Bever, Hoffman & Harms, LLP (57) ABSTRACT

A hybrid output driver includes a voltage mode main driver and a current mode emphasis driver that provides an adjustable differential output voltage swing. The current mode emphasis driver provides: push-pull swing control currents in response to a cursor data value, push-pull precursor currents in response to a precursor data value, and push-pull postcursor currents in response to a postcursor data value. In a normal operating mode, the swing control currents oppose voltages imposed by the voltage mode main driver on the differential output terminals. In a turbo operating mode, the swing control currents enhance voltages imposed by the voltage mode main driver on the differential output terminals.

22 Claims, 4 Drawing Sheets

HYBRID DRIVER INCLUDING A TURBO MODE

RELATED APPLICATION

This application claims priority under 35 U.S.C. §119(e) to U.S. Provisional Application Ser. No. 61/662,322, entitled "Hybrid Driver Including A Turbo Mode", filed on Jun. 20, 2012, which is herein incorporated by reference in its entirety.

FIELD OF THE INVENTION

The present invention relates to a hybrid output driver that includes both a voltage mode component and a current mode component.

RELATED ART

The design of output driver circuits becomes more difficult as these circuits are required to operate at higher speeds (e.g., 12.5 Gb/s). Parameters that must be considered in the design of an output driver circuit include: operating speed, jitter, noise, required layout area, circuit complexity, return loss and power consumption. It would be desirable to have an improved output driver circuit design that is capable at operating at a high frequency, while minimizing jitter, noise, required layout area, circuit complexity, return loss and power consumption.

SUMMARY

Accordingly, the present invention provides a hybrid output driver circuit that includes a voltage mode main driver and one or more current mode emphasis drivers. The differential output voltage swing is adjusted by the current mode emphasis drivers. The current mode emphasis drivers sources/sinks currents to/from the differential output terminals of the hybrid output driver in response to corresponding emphasis signals.

Accordingly, the present invention provides a hybrid output driver that includes a voltage mode main driver and a current mode emphasis driver that provides an adjustable differential output voltage swing. The current mode emphasis driver includes a swing control current mode driver that provides push-pull swing control currents in response to a cursor data value, a precursor current mode driver that provides push-pull precursor currents in response to a precursor data value, and a postcursor current mode driver that provides push-pull postcursor currents in response to a postcursor data value. In a normal operating mode, the swing control currents oppose voltages developed by the voltage mode main driver on the differential output terminals. In a turbo operating mode, the swing control currents enhance voltages developed by the voltage mode main driver on the differential output terminals.

The present invention will be more fully understood in view of the following description and drawings.

BRIEF DESCRIPTION OF THE DRAWINGS

FIG. 3, which includes

DETAILED DESCRIPTION

Figure 1:
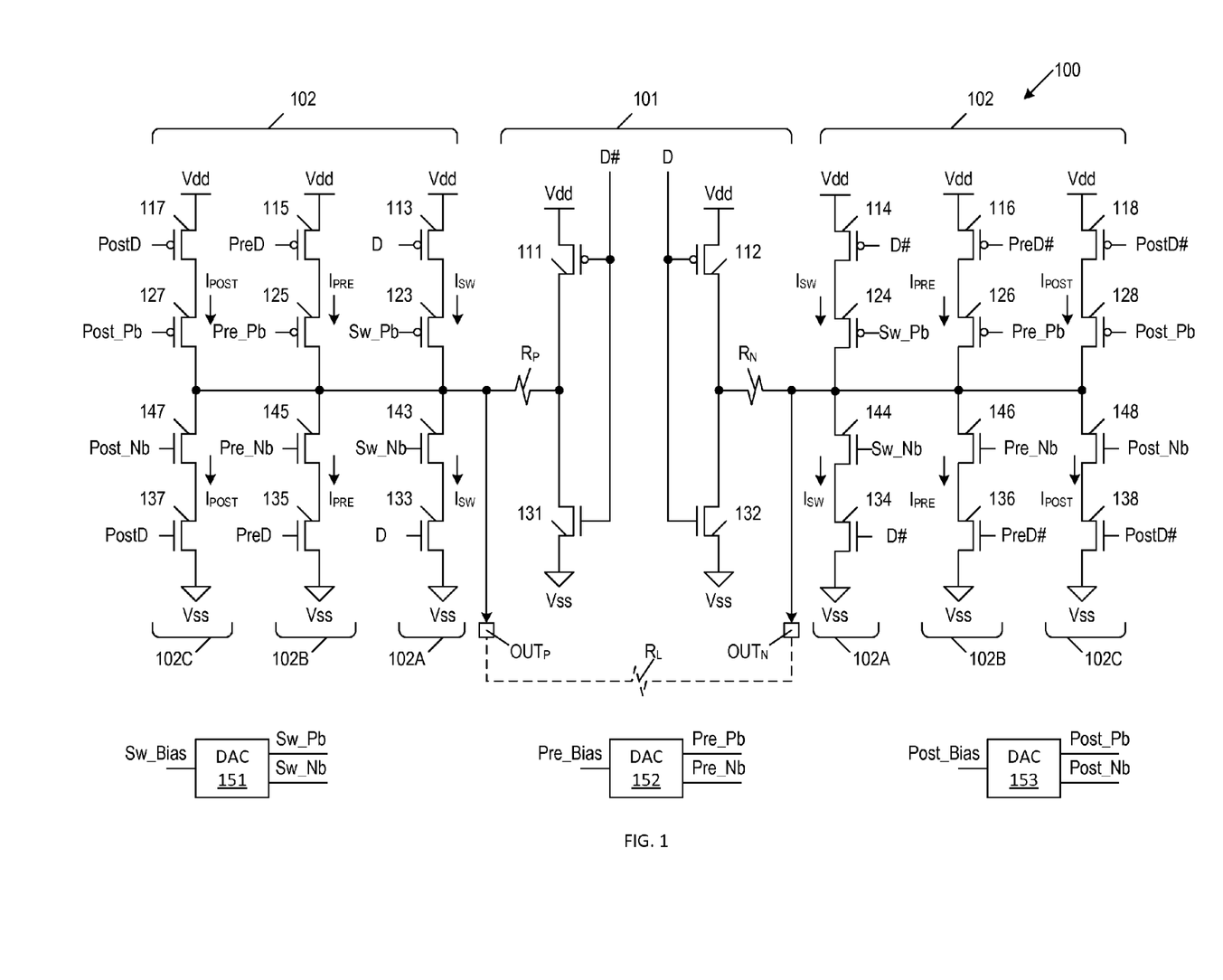
FIG. 1 is a circuit diagram of a hybrid output driver circuit in accordance with one embodiment of the present invention.

FIG. 1 is a circuit diagram of an output driver circuit 100 in accordance with one embodiment of the present invention. Output driver circuit 100 includes voltage mode main driver circuit 101 and current mode emphasis driver circuits 102. Current mode emphasis driver circuits 102 include swing control current mode emphasis driver circuit 102A, precursor current mode emphasis driver circuit 102B and postcursor current mode emphasis driver circuit 102C. Because the output driver circuit 100 of FIG. 1 includes both a voltage mode driver component and current mode driver components, this output driver circuit 100 may be referred to as a 'hybrid' driver circuit. As described in more detail below, voltage mode main driver circuit 101 is capable of operating with a programmable output voltage swing adjustment. As also described in more detail below, current mode emphasis driver circuit 102 performs emphasis and swing control functions within hybrid driver circuit 100.

Hybrid driver circuit 100 is a differential signal driver, which drives a differential output signal across output terminals $OUT_P$ and $OUT_N$, to an external load resistor $R_L$. In the embodiments described herein, the load resistor $R_L$ has a resistance of 100 Ohms. However, it is understood that the load resistor $R_L$ may have other resistances in other embodiments.

Voltage mode main driver circuit 101 includes p-channel transistors 111-112, n-channel transistors 131-132, and fixed resistors $R_P$ and $R_N$. In the described embodiments, the Vdd supply voltage applied to the Vdd supply voltage terminal has a nominal value of about 900 mV and a minimum value of 850 mV (although it is understood that other Vdd supply voltages can be used in other embodiments). P-channel transistor 111 and n-channel transistor 131 are connected in series between the Vdd supply voltage terminal and a Vss supply voltage terminal (e.g., ground terminal), thereby forming an inverter circuit. Resistor $R_P$ is connected between the commonly-coupled drains of transistors 111 and 131 and the output terminal $OUT_P$.

Similarly, p-channel transistor 112 and n-channel transistor 132 are connected in series between the Vdd supply voltage terminal and the Vss supply voltage terminal, thereby forming an inverter circuit. Resistor $R_N$ is connected between the commonly-coupled drains of transistors 112 and 132 and the output terminal $OUT_N$. In the embodiments described herein, each of the resistors $R_P$ and $R_N$ has a resistance of 50 Ohms. However, it is understood that the resistors $R_P$ and $R_N$ may have other resistances in other embodiments, wherein the resistances of resistors $R_P$ and $R_N$ are selected in view of the resistance of load resistor $R_L$, in a manner known to those of ordinary skill in the art.

The gates of transistors 112 and 132 are each coupled to receive a cursor data value D, and the gates of transistors 111 and 131 are each coupled to receive the inverse of the cursor data value D (i.e., complementary cursor data value D#). The cursor data values D/D# represent cursor data provided to hybrid driver circuit 100. In accordance with one embodiment, the cursor data values D/D# exhibit a full CMOS voltage swing, between the Vdd and Vss supply voltages.

Current mode emphasis driver circuit 102 includes p-channel transistors 113-118 and 123-128, and n-channel transistors 133-138 and 143-148. P-channel transistors 113, 115 and 117 are connected in series with corresponding p-channel transistors 123, 125 and 127, respectively, between the Vdd supply voltage terminal and the output terminal $OUT_P$. N-channel transistors 133, 135 and 137 are connected in series with corresponding n-channel transistors 143, 145 and 147, respectively, between the Vss supply voltage terminal and the output terminal $OUT_P$. P-channel transistors 114, 116 and 118 are connected in series with corresponding p-channel transistors 124, 126 and 128, respectively, between the Vdd supply voltage terminal and the output terminal $OUT_N$. N-channel transistors 134, 136 and 138 are connected in series with corresponding n-channel transistors 144, 146 and 148, respectively, between the Vss supply voltage terminal and the output terminal $OUT_N$.

As described in more detail below, p-channel transistors 123, 125 and 127 operate as current supplies capable of sourcing currents $I_{SW}$, $I_{PRE}$ and $I_{POST}$, respectively, to output terminal $OUT_P$ (thereby increasing a voltage on output terminal $OUT_P$). Similarly, p-channel transistors 124, 126 and 128 operate as current supplies capable of sourcing currents $I_{SW}$, $I_{PRE}$ and $I_{POST}$, respectively, to output terminal $OUT_N$ (thereby increasing a voltage on output terminal $OUT_N$). N-channel transistors 143, 145 and 147 operate as current supplies capable of sinking currents $I_{SW}$, $I_{PRE}$ and $I_{POST}$, respectively, from output terminal $OUT_P$ (thereby reducing a voltage on output terminal $OUT_P$). Similarly, n-channel transistors 144, 146 and 148 operate as current supplies capable of sinking currents $I_{SW}$, $I_{PRE}$ and $I_{POST}$, respectively, from output terminal $OUT_N$ (thereby reducing a voltage on output terminal $OUT_N$).

P-channel transistors 113-114 and 123-124, and n-channel transistors 133-134 and 143-144 are configured to form the swing control current mode emphasis driver 102A. The gates of p-channel transistors 123 and 124 are biased by a bias control signal Sw_Pb, and the gates of n-channel transistors 143 and 144 are biased by a bias control signal Sw_Nb. The bias control signals Sw_Pb and Sw_Nb are selected to enable each of the transistors 123, 124, 143 and 144 to operate as a current supply, each having a corresponding swing control current (when enabled) of $I_{SW}$. In the described embodiments, the swing control current $I_{SW}$ is controlled to have a value of about 1 milliAmps (mA), thereby providing a 50 mV swing change at differential output ($OUT_P$, $OUT_N$) in the described example (i.e., 1 mA*50 Ohm=50 mV). However, it is understood that the swing control current $I_{SW}$ can be adjusted to provide a desired differential voltage swing across the output terminals $OUT_P$ and $OUT_N$. Note that the current supplies implemented by transistors 123, 124, 143 and 144 are effectively 'enabled' when the corresponding series-connected select transistors 113, 114, 133 and 134, respectively, are turned on. The gates of select transistors 113 and 133 are coupled to receive the cursor data value D, and the gates of select transistors 114 and 134 are coupled to receive the complementary cursor data value D#.

P-channel transistors 115-116 and 125-126, and n-channel transistors 135-136 and 145-146 are configured to form the precursor current mode emphasis driver 102B. The gates of p-channel transistors 125 and 126 are biased by bias control signal Pre_Pb, and the gates of n-channel transistors 145 and 146 are biased by bias control signal Pre_Nb. The bias control signals Pre_Pb and Pre_Nb are selected to enable each of the transistors 125, 126, 145 and 146 to operate as a current supply, each having a corresponding precursor emphasis current (when enabled) of $I_{PRE}$. In the described embodiments, the precursor emphasis current $I_{PRE}$ is controlled to have a value of about 2.25 mA, thereby providing a precursor voltage swing change to the differential output ($OUT_P$, $OUT_N$) of about ¼ the main cursor (which is operating in voltage mode with a differential 450 mV voltage swing) (i.e., 2.25 mA*50 Ohm=¼*450 mV). However, it is understood that the precursor emphasis current $I_{PRE}$ can be adjusted to have other values in other embodiments. Note that the current supplies implemented by transistors 125, 126, 145 and 146 are effectively 'enabled' when the corresponding series-connected select transistors 115, 116, 135 and 136, respectively, are turned on. The gates of select transistors 115 and 135 are coupled to receive the precursor data value PreD, and the gates of select transistors 116 and 136 are coupled to receive the complementary precursor data value PreD#.

P-channel transistors 117-118 and 127-128, and n-channel transistors 137-138 and 147-148 are configured to form the postcursor current mode emphasis driver 102C. The gates of p-channel transistors 127 and 128 are biased by bias control signal Post_Pb, and the gates of n-channel transistors 147 and 148 are biased by bias control signal Post_Nb. The bias control signals Post_Pb and Post_Nb are selected to enable each of the transistors 127, 128, 147 and 148 to operate as a current supply, each having a corresponding postcursor emphasis current (when enabled) of $I_{POST}$. In the described embodiments, the postcursor emphasis current $I_{POST}$ is controlled to have a value of about 3 mA, thereby providing a postcursor voltage swing change of about ⅓ the main cursor voltage swing (i.e., 3 mA*50 Ohm=⅓*450 mV). However, it is understood that the postcursor emphasis current $I_{POST}$ can be adjusted to have other values in other embodiments. Note that the current supplies implemented by transistors 127, 128, 147 and 148 are effectively 'enabled' when the corresponding series-connected select transistors 117, 118, 137 and 138, respectively, are turned on. The gates of select transistors 117 and 137 are coupled to receive the postcursor data value PostD, and the gates of select transistors 118 and 138 are coupled to receive the complementary postcursor data value PostD#.

In accordance with one embodiment, the bias control signals Sw_Pb, Sw_Nb, Pre_Pb, Pre_Nb, Post_Pb and Post_Nb are analog control signals that are generated by digital to analog converters (DACs) 151-153. More specifically bias control signals Sw_Pb and Sw_Nb are generated by DAC 151 in response to a digital control signal Sw_Bias; bias control signals Pre_Pb and Pre_Nb are generated by DAC 152 in response to a digital control signal Pre_Bias; and bias control signals Post_Pb and Post_Nb are generated by DAC 153 in response to digital control signal Post_Bias. Note that the values of bias control signals Sw_Pb, Sw_Nb, Pre_Pb, Pre_Nb, Post_Pb and Post_Nb can be controlled to adjust the currents $I_{SW}$, $I_{PRE}$ and $I_{POST}$ to desired values to optimize the performance of hybrid driver circuit 100.

Although not illustrated in FIG. 1, the body regions of p-channel transistors 111-118 and 123-128 are coupled to the Vdd supply voltage terminal, and the body regions of n-channel transistors 131-138 and 143-148 are coupled to the Vss supply voltage terminal.

Hybrid driver circuit 100 implements three tap finite impulse response (FIR) equalization in the illustrated embodiment. Although the present invention is described in connection with a three tap embodiment, it is understood that other numbers of current mode taps can be implemented, depending upon the desired amount of equalization. In the embodiment illustrated by FIG. 1, cursor data (D/D#), pre-cursor data (PreD/PreD#) and post-cursor data (PostD/PostD#) correspond with the three taps. In the illustrated embodiment, the pre-cursor data (PreD/PreD#) leads the cursor data (D/D#) by one cursor data bit time. In the illustrated embodiment, the post-cursor data (PostD/PostD#) is the cursor data (D/D#) delayed by one cursor data bit time. In other embodiments, different taps can be used to implement pre-cursor data and/or post-cursor data. In various embodiments, the emphasis signals used to control the various taps are time-shifted versions of the cursor data.

Current mode emphasis driver circuit 102 operates in a push-pull manner. Thus, if the swing control current $I_{SW}$, precursor current $I_{PRE}$, or post-cursor current $I_{POST}$ is sourced (pushed) to the output terminal $OUT_P$, then the swing control current $I_{SW}$, precursor current $I_{PRE}$, or post-cursor current $I_{POST}$ is also simultaneously sunk (pulled) from the output terminal $OUT_N$. Similarly, if the swing control current $I_{SW}$, precursor current $I_{PRE}$, or post-cursor current $I_{POST}$ is sunk (pulled) from the output terminal $OUT_P$, then the swing control current $I_{SW}$, precursor current $I_{PRE}$, or post-cursor current $I_{POST}$ is also simultaneously sourced (pushed) to the output terminal $OUT_N$. This push-pull operation results in significant power savings within hybrid driver circuit 100, because the same currents $I_{SW}$, $I_{PRE}$ and $I_{POST}$ are used as current sources and current sinks to affect the voltages developed on both output terminals $OUT_P$ and $OUT_N$.

Figure 2:
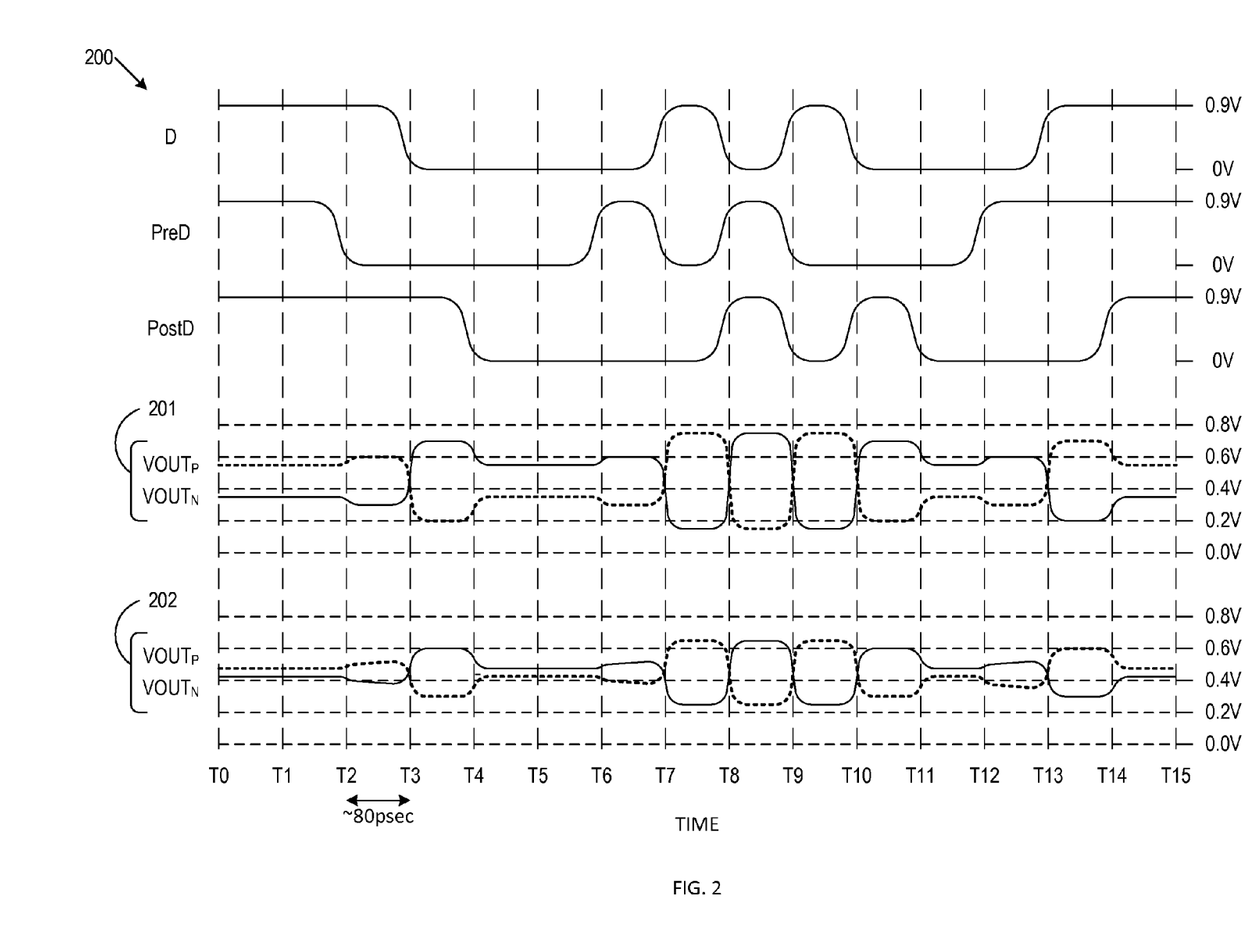
FIG. 2 is a waveform diagram illustrating the operation of the hybrid output driver circuit of FIG. 1 in accordance with various embodiments of the present invention.

FIG. 2 is a waveform diagram 200 illustrating the operation of hybrid driver circuit 100 in accordance with one embodiment of the present invention. In the example of FIG. 2, the cursor data (D/D#), the precursor data (PreD/PreD#) and the postcursor data (PostD/PostD#) swing between the Vdd supply voltage of 0.9 Volts and the Vss supply voltage of 0 Volts, as illustrated. Note that FIG. 2 only shows cursor value D, pre-cursor value PreD and post-cursor value PostD. It is understood that the complementary values D#, PreD# and PostD# are inverted versions of the values D, PreD and PostD, respectively. The various signals illustrated in FIG. 2 are switched at data rate of about 12.5 Gb/s (gigabits/second), or at a bit time of 80 psec.

The voltages provided on output terminals $OUT_P$ and $OUT_N$ are labeled $VOUT_P$ and $VOUT_N$, respectively, in FIG. 2. Note that FIG. 2 provides two different exemplary sets of differential output voltages 201 and 202, which can be provided by hybrid driver circuit 100 in response to the illustrated values D, PreD and PostD. Differential output voltages 201 are provided by hybrid driver circuit 100 when the currents $I_{SW}$, $I_{PRE}$ and $I_{POST}$ are controlled to have values of 1 mA, 1 mA and 3 mA, respectively.

Differential output voltages 202 are provided by hybrid driver circuit 100 when the current $I_{SW}$ is controlled to have a value of 4.5 mA, and the currents $I_{PRE}$ and $I_{POST}$ are controlled to have values of 1 mA and 2.5 mA, respectively. Differential output voltages 201 and 202 are shown to illustrate the effect that changing the currents $I_{SW}$, $I_{PRE}$ and $I_{POST}$ may have on the output of hybrid driver circuit 100. It is understood that the currents $I_{SW}$, $I_{PRE}$ and $I_{POST}$ can be varied to provide the desired operating conditions to hybrid driver circuit 100.

Within hybrid driver circuit 100, the voltage mode driver 101 provides the main cursor, without requiring a current mode logic (CML) current mode driver. The push-pull configuration of current mode driver circuit 102 is used control the pre-cursor and post-cursor, as well as swing control. Note that the swing control current $I_{SW}$ is used to reduce the voltages built from the main cursor voltage mode driver 101. Push-pull current mode driver circuit 102 advantageously only requires about one half of the current as a stand-alone CML current mode driver that provides the same operating capabilities as hybrid driver circuit 100. As a result, hybrid driver circuit 100 exhibits significant power savings when compared with a stand-alone CML current mode driver. In addition, because hybrid driver circuit 100 switches smaller currents to achieve the same voltage swing as a comparable CML current mode driver, the sizes of the switches (transistors) implemented by hybrid driver circuit 100 can be significantly smaller than the switches (transistors) required by CML current mode driver. The required layout area for hybrid driver circuit 100 is relatively small.

Figure 3A:
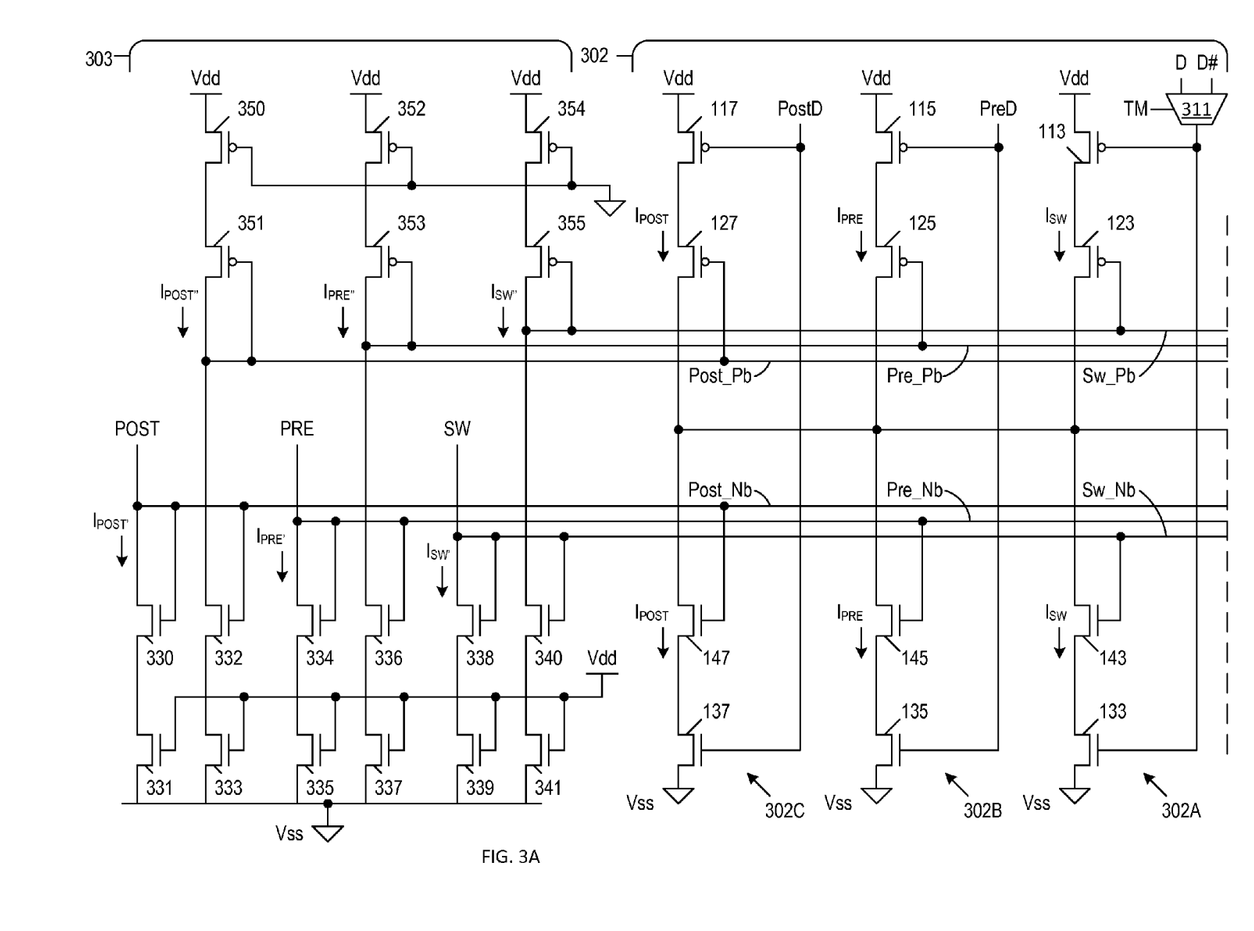
FIGS. 3A and 3B, is a circuit diagram of a hybrid output driver circuit in accordance with an alternate embodiment of the present invention.
Figure 3B:
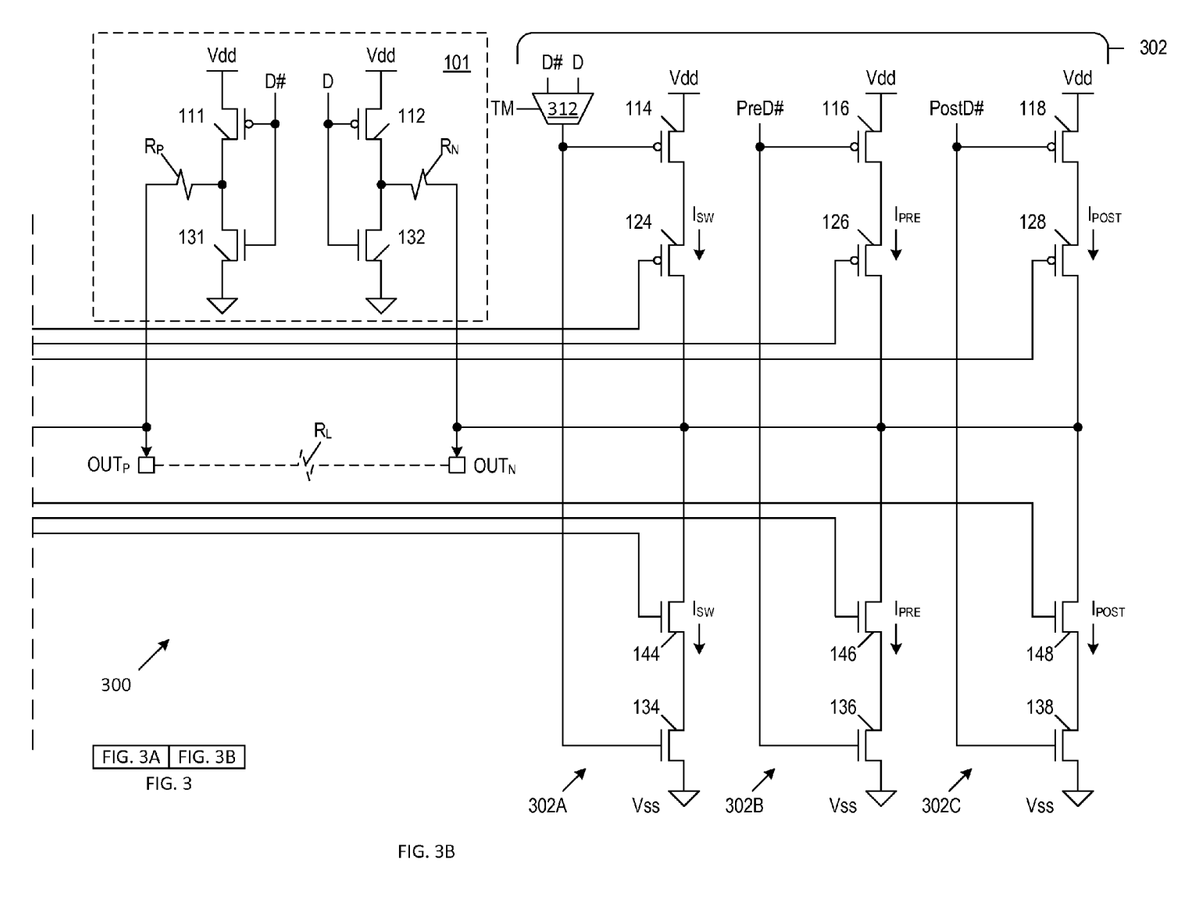

FIG. 3, which includes FIG. 3A and FIG. 3B, is a circuit diagram of a hybrid driver circuit 300 in accordance with an alternate embodiment of the present invention. Hybrid driver circuit 300 includes voltage mode main driver 101, which has been described above in connection with FIG. 1. In addition, hybrid driver circuit 300 includes current mode emphasis driver circuit 302, which includes swing control current mode emphasis driver circuit 302A, precursor current mode emphasis driver circuit 302B and postcursor current mode emphasis driver circuit 302C. Because current mode emphasis driver circuit 302 is similar to current mode emphasis driver circuit 102 of FIG. 1, similar elements of current mode emphasis driver circuits 102 and 302 are labeled with similar reference numbers. Thus, current mode emphasis driver circuit 302 includes p-channel transistors 113-118 and 123-128, as well as n-channel transistors 133-138 and 143-148, which have been described above.

The gates of transistors 113 and 133 are coupled to the output of multiplexer 311, and the gates of transistors 114 and 134 are coupled to the output of multiplexer 312. As described in more detail below, multiplexers 311 and 312 enable hybrid driver circuit 300 to operate in a normal mode (similar to the operating mode described above in connection with hybrid driver circuit 100) and a turbo mode, which provides for increased voltage swing on the differential output signal provided on output terminals $OUT_P$ and $OUT_N$.

FIG. 3 also illustrates bias control circuit 303, which provides the bias control signals Sw_Pb, Sw_Nb, Pre_Pb, Pre_Nb, Post_Pb and Post_Nb to hybrid driver circuit 300. It is understood that bias control circuit 303 can simultaneously provide these bias control signals to a plurality of hybrid driver circuits in parallel. Note that the hybrid driver circuit 100 of FIG. 1 can use the bias control circuit 303 of FIG. 3 in one embodiment of the present invention.

Bias control circuit 303 includes n-channel transistors 330-341 and p-channel transistors 350-355. Although not illustrated in FIG. 3, the body regions of n-channel transistors 330-341 are coupled to the Vss voltage supply terminal, and the body regions of p-channel transistors 350-355 are coupled to the Vdd voltage supply terminal. In general, transistors 330-341 and 350-355 form a series of current mirror circuits, which reflect reference currents $I_{POST'}$, $I_{PRE'}$ and $I_{SW'}$ to create the corresponding currents $I_{POST}$, $I_{PRE}$ and $I_{SW}$, respectively.

For example, n-channel transistors 330-331 are connected in a current mirror configuration with n-channel transistors 332-333, wherein a reference current $I_{POST'}$ introduced to transistors 330-331 (i.e., on a pin labeled 'POST') causes a corresponding reference current $I_{POST''}$ to flow through n-channel transistors 332-333 (i.e., the reference current $I_{POST'}$ is 'reflected' to create the corresponding reference current $I_{POST''}$). N-channel transistors 147 and 148 of current mode emphasis driver circuit 302 are each connected in a current mirror configuration with n-channel transistor 332, whereby the reference current $I_{POST''}$ causes the above-described postcursor current $I_{POST}$ to flow through these n-channel transistors 147 and 148 when the corresponding select transistors 137 and 138, respectively, are turned on (i.e., the reference current $I_{POST''}$ is 'reflected' to create the corresponding post cursor currents $I_{POST}$). In a particular embodiment, n-channel transistors 331, 333, 137 and 138 are identical transistors, and n-channel transistors 330, 332, 147 and 148 are identical transistors, such that $I_{POST'} = I_{POST''} = I_{POST}$. In other embodiments, these n-channel transistors can be sized differently to provide desired ratios between the currents $I_{POST'}$, $I_{POST''}$ and $I_{POST}$ in a manner known to those skilled in the art.

P-channel transistors 350-351 are connected in series with n-channel transistors 332-333, such that the reference current $I_{POST''}$ also flows through p-channel transistors 350-351. P-channel transistors 127 and 128 of current mode emphasis driver circuit 302 are each connected in a current mirror configuration with p-channel transistor 351, whereby the reference current $I_{POST''}$ causes the above-described postcursor current $I_{POST}$ to flow through these p-channel transistors 127 and 128 when the corresponding select transistors 127 and 128, respectively, are turned on (i.e., the reference current $I_{POST''}$ is 'reflected' to create the postcursor currents $I_{POST}$). In a particular embodiment, p-channel transistors 351, 127 and 128 are identical transistors, and p-channel transistors 350, 117 and 118 are identical transistors, such that $I_{POST'}=I_{POST''}=I_{POST}$. In other embodiments, these p-channel transistors can be sized differently to provide desired ratios between the currents $I_{POST'}$, $I_{POST''}$ and $I_{POST}$ in a manner known to those skilled in the art.

N-channel transistors 334-337 and p-channel transistors 352-353 operate in a similar manner, wherein a reference current $I_{PRE'}$ (introduced to the pin labeled 'PRE') is reflected to provide a corresponding reference current $I_{PRE''}$, which, in turn, is reflected to provide the above-described precursor current $I_{PRE}$ to n-channel transistors 145-146 and p-channel transistors 125-126. In one embodiment, n-channel transistors 335, 337, 135 and 136 are identical transistors, n-channel transistors 334, 336, 145 and 146 are identical transistors, p-channel transistors 353, 125 and 126 are identical transistors, and p-channel transistors 352, 115 and 116 are identical transistors. Again, these transistors can have different sizes to provide desired current ratios between the various current mirror stages in other embodiments.

N-channel transistors 338-341 and p-channel transistors 354-355 also operate in a similar manner, wherein a reference current $I_{SW'}$ (introduced to the pin labeled 'SW') is reflected to provide a corresponding reference current $I_{SW''}$, which in turn, is reflected to provide the above-described swing control current $I_{SW}$ to n-channel transistors 143-144 and p-channel transistors 123-124. In one embodiment, n-channel transistors 339, 341, 133 and 134 are identical transistors, n-channel transistors 338, 340, 143 and 144 are identical transistors, p-channel transistors 355, 123 and 124 are identical transistors, and p-channel transistors 354, 113 and 114 are identical transistors. Again, these transistors can have different sizes to provide desired current ratios between the various current mirror stages in other embodiments.

Cascoded current mirrors formed by n-channel transistors (330, 331), n-channel transistors (332, 333), n-channel transistors (147, 137), n-channel transistors (148, 138), p-channel transistors (351, 350), p-channel transistors (127, 117) and p-channel transistors (128, 118) are used to for matching current accuracy when the postcursor current $I_{POST}$ is sourced through p-channel transistors (128, 118) and simultaneously sunk through n-channel transistors (147, 137) in response to the PostD and PostD# values (i.e., PostD=1, PostD#=0), and also when the postcursor current $I_{POST}$ is sourced through p-channel transistors (127, 117) and simultaneously sunk through n-channel transistors (148, 138) in response to the PostD and PostD# values (i.e., PostD=0, PostD#=1). Note that for the transistor pairs (A, B) listed above (and below), transistor 'A' represents a main current source transistor, and transistor 'B' represents a cascoded transistor that replicates the corresponding data switching driver in the 'on' state.

Cascoded current mirrors formed by n-channel transistors (334, 335), n-channel transistors (336, 337), n-channel transistors (145, 135), n-channel transistors (146, 136), p-channel transistors (353, 352), p-channel transistors (125, 115) and p-channel transistors (126, 116) are used to for matching current accuracy when the precursor current $I_{PRET}$ is sourced through p-channel transistors (126, 116) and simultaneously sunk through n-channel transistors (145, 135) in response to the PreD and PreD# values (i.e., PreD=1, PreD#=0), and also when the precursor current $I_{PRE}$ is sourced through p-channel transistors (125, 115) and simultaneously sunk through n-channel transistors (146, 136) in response to the PreD and PreD# values (i.e., PreD=0, PreD#=1).

Similarly, Cascoded current mirrors formed by n-channel transistors (338, 339), n-channel transistors (340, 341), n-channel transistors (143, 133), n-channel transistors (144, 134), p-channel transistors (355, 354), p-channel transistors (123, 113) and p-channel transistors (124, 114) are used to for matching current accuracy when the swing control current $I_{SW}$ is sourced through p-channel transistors (124, 114) and simultaneously sunk through n-channel transistors (143, 133) in response to the D and D# values (i.e., D=1, D#=0), and also when the swing control current $I_{SW}$ is sourced through p-channel transistors (123, 113) and simultaneously sunk through n-channel transistors (144, 134) in response to the D and D# values (i.e., D=0, D#=1).

Multiplexers 311 and 312 are controlled by a turbo mode control signal TM. When the turbo mode control signal TM has a logic '0' value, multiplexers 311 and 312 route the cursor data value D and the complementary cursor data value D#, respectively, thereby enabling normal operating mode. In normal operating mode, hybrid driver circuit 300 operates in a manner similar to hybrid driver circuit 100. For example, if the cursor data value D has a logic '1' value (and the complementary cursor data value D# has a logic '0' value), then n-channel transistor 132 turns on, pulling the voltage on output terminal $OUT_N$ down toward the Vss supply voltage, and p-channel transistor 114 turns on, thereby sourcing swing control current $I_{SW}$ to the output terminal $OUT_N$, thereby pulling up the voltage on the output terminal $OUT_N$. Also under these conditions, p-channel transistor 111 turns on, pulling the voltage on output terminal $OUT_P$ up toward the Vdd supply voltage, and n-channel transistor 133 turns on, thereby sinking swing control current $I_{SW}$ from the output terminal $OUT_P$, thereby pulling down the voltage on the output terminal $OUT_P$. Thus, in the normal operating mode, the swing control current $I_{SW}$ pulls the voltages on the output terminals $OUT_N$ and $OUT_P$ in opposite directions as the voltage mode driver circuit 101.

When the turbo mode control signal TM has a logic '1' value, multiplexers 311 and 312 route the complementary cursor data D# and the cursor data value D, respectively, thereby enabling the turbo operating mode. In the turbo operating mode, the current mode emphasis driver circuit 302 will introduce the swing control current $I_{SW}$ in a manner that enhances the voltages introduced by the voltage mode driver circuit 101 on output terminals $OUT_N$ and $OUT_P$. For example, if the cursor data value D has a logic '1' value (and the complementary cursor data value D# has a logic '0' value), then n-channel transistor 132 turns on, pulling the voltage on output terminal $OUT_N$ down toward the Vss supply voltage, and n-channel transistor 134 turns on, thereby sinking swing control current $I_{SW}$ from the output terminal $OUT_N$, thereby pulling down the voltage on the output terminal $OUT_N$. Also under these conditions, p-channel transistor 111 turns on, pulling the voltage on output terminal $OUT_P$ up toward the Vdd supply voltage, and p-channel transistor 113 turns on, thereby sourcing swing control current $I_{SW}$ to the output terminal $OUT_P$, thereby pulling up the voltage on the output terminal $OUT_P$. Thus, in the turbo operating mode, the swing control current $I_{SW}$ pulls the voltages on the output terminals $OUT_N$ and $OUT_P$ in the same directions as the voltage mode driver circuit 101. This advantageously increases the differential voltage swing of the output voltages developed on output terminals $OUT_N$ and $OUT_P$.

Although the present invention has been described in connection with several embodiments, it is understood that this invention is not limited to the embodiments disclosed, but is capable of various modifications which would be apparent to one of ordinary skill in the art. Thus, the invention is limited only by the following claims.

I claim:

1. A driver circuit comprising:
  a voltage mode main driver configured to drive a first differential output terminal through a first resistor, and a second differential output terminal through a second resistor in response to a cursor data value, wherein the voltage mode main driver circuit drives the first differential output terminal toward a first supply voltage and the second differential output terminal toward a second supply voltage when the cursor data value has a first logic value; and
  a swing control current emphasis driver having a first configuration wherein a first swing control current is coupled to the first differential output terminal in a manner that pulls the first differential output terminal toward the second supply voltage, and a second swing control current is coupled to the second differential output terminal in a manner that pulls the second differential output terminal toward the first supply voltage, when the cursor data value has the first logic value.

2. The driver circuit of claim 1, wherein the first swing control current is equal to the second swing control current.

3. The driver circuit of claim 1, wherein the swing control current emphasis driver has a second configuration wherein the first swing control current is coupled to the first differential output terminal in a manner that pulls the first differential output terminal toward the first supply voltage, and the second swing control current is coupled to the second differential output terminal in a manner that pulls the second differential output terminal toward the second supply voltage when the cursor data has the first logic value.

4. The driver circuit of claim 1, further comprising:
  a precursor current emphasis driver configured to couple a first precursor current to the first differential output terminal in a manner that pulls the first differential output terminal toward the second supply voltage, and couple a second precursor current to the second differential output terminal in a manner that pulls the second differential output terminal toward the first supply voltage, when a precursor data value derived from the cursor data value has the first logic value.

5. The driver circuit of claim 4, wherein the precursor current emphasis driver is further configured to couple the first precursor current to the first differential output terminal in a manner that pulls the first differential output terminal toward the first supply voltage, and couple the second precursor current to the second differential output terminal in a manner that pulls the second differential output terminal toward the second supply voltage when the precursor data value has a second logic value.

6. The driver circuit of claim 4, further comprising:
  a postcursor current emphasis driver configured to couple a first postcursor current to the first differential output terminal in a manner that pulls the first differential output terminal toward the second supply voltage, and couple a second postcursor current to the second differential output terminal in a manner that pulls the second differential output terminal toward the first supply voltage, when a postcursor data value derived from the cursor data value has the first logic value.

7. The driver circuit of claim 6, wherein the postcursor current emphasis driver is further configured to couple the first postcursor current to the first differential output terminal in a manner that pulls the first differential output terminal toward the first supply voltage, and couple the second postcursor current to the second differential output terminal in a manner that pulls the second differential output terminal toward the second supply voltage when the postcursor data value has a second logic value.

8. The driver circuit of claim 1, further comprising:
  a postcursor current emphasis driver configured to couple a first postcursor current to the first differential output terminal in a manner that pulls the first differential output terminal toward the second supply voltage, and couple a second postcursor current to the second differential output terminal in a manner that pulls the second differential output terminal toward the first supply voltage, when a postcursor data value derived from the cursor data value has the first logic value.

9. The driver circuit of claim 8, wherein the postcursor current emphasis driver is further configured to couple the first postcursor current to the first differential output terminal in a manner that pulls the first differential output terminal toward the first supply voltage, and couple the second postcursor current to the second differential output terminal in a manner that pulls the second differential output terminal toward the second supply voltage when the postcursor data value has a second logic value.

10. The driver circuit of claim 1, wherein the voltage mode main driver comprises:
  a first inverter having an input coupled to receive the cursor data value and an output coupled to the first differential output terminal through the first resistor;
  a second inverter having an input coupled to receive the inverse of the cursor data value and an output coupled to the second differential output terminal through the second resistor.

11. The driver circuit of claim 10, wherein the first inverter and the second inverter are powered by the first supply voltage and the second supply voltage, wherein the cursor data value exhibits a signal swing between the first supply voltage and the second supply voltage.

12. The driver circuit of claim 1, further comprising means for adjusting the first and second swing control currents to select an output voltage swing across the first and second differential output terminals.

13. A method comprising:
  driving a first differential voltage on a first differential output terminal toward a first supply voltage through a first resistor, and driving a second differential voltage on a second differential output terminal toward a second supply voltage through a second resistor in response to a cursor data value having a first logic value; and
  in a first mode, sourcing a first swing control current to the first differential output terminal in a manner that pulls the first differential output terminal toward the second supply voltage, and simultaneously sinking a second swing control current from the second differential output terminal in a manner that pulls the second differential output terminal toward the first supply voltage, in response to the cursor data value having the first logic value.

14. The method of claim 13, wherein the first swing control current is equal to the second swing control current.

15. The method of claim 13, further comprising:
in a second mode, coupling the first swing control current to the first differential output terminal in a manner that pulls the first differential output terminal toward the first supply voltage, and coupling the second swing control current to the second differential output terminal in a manner that pulls the second differential output terminal toward the second supply voltage when the cursor data has the first logic value.

16. The method of claim 13, further comprising coupling a first precursor current to the first differential output terminal in a manner that pulls the first differential output terminal toward the second supply voltage, and coupling a second precursor current to the second differential output terminal in a manner that pulls the second differential output terminal toward the first supply voltage, when a precursor data value derived from the cursor data value has the first logic value.

17. The method of claim 16, further comprising coupling the first precursor current to the first differential output terminal in a manner that pulls the first differential output terminal toward the first supply voltage, and coupling the second precursor current to the second differential output terminal in a manner that pulls the second differential output terminal toward the second supply voltage, when the precursor data value has a second logic value.

18. The method of claim 16, further comprising coupling a first postcursor current to the first differential output terminal in a manner that pulls the first differential output terminal toward the second supply voltage, and coupling a second postcursor current to the second differential output terminal in a manner that pulls the second differential output terminal toward the first supply voltage, when a postcursor data value derived from the cursor data value has the first logic value.

19. The method of claim 18, further comprising coupling the first postcursor current to the first differential output terminal in a manner that pulls the first differential output terminal toward the first supply voltage, and coupling the second postcursor current to the second differential output terminal in a manner that pulls the second differential output terminal toward the second supply voltage, when the postcursor data value has a second logic value.

20. The method of claim 13, further comprising coupling a first postcursor current to the first differential output terminal in a manner that pulls the first differential output terminal toward the second supply voltage, and coupling a second postcursor current to the second differential output terminal in a manner that pulls the second differential output terminal toward the first supply voltage, when a postcursor data value derived from the cursor data value has the first logic value.

21. The method of claim 20, further comprising coupling the first postcursor current to the first differential output terminal in a manner that pulls the first differential output terminal toward the first supply voltage, and coupling the second postcursor current to the second differential output terminal in a manner that pulls the second differential output terminal toward the second supply voltage, when the postcursor data value has a second logic value.

22. The method of claim 13, further comprising adjusting the first and second swing control currents to select an output voltage swing across the first and second differential output terminals.

* * * * *